(12) United States Patent
Jones et al.

(10) Patent No.: US 8,179,656 B2
(45) Date of Patent: May 15, 2012

(54) SURGE PROTECTION CIRCUIT FOR PASSING DC AND RF SIGNALS

(75) Inventors: Jonathan L. Jones, Carson City, NV (US); Chris Penwell, Minden, NV (US)

(73) Assignee: Transtector Systems, Inc., Hayden, ID (US)

( * ) Notice: Subject to any disclaimer, the term of this patent is extended or adjusted under 35 U.S.C. 154(b) by 0 days.

(21) Appl. No.: 13/035,126

(22) Filed: Feb. 25, 2011

(65) Prior Publication Data

US 2011/0141646 A1    Jun. 16, 2011

Related U.S. Application Data

(63) Continuation of application No. 12/262,107, filed on Oct. 30, 2008, now Pat. No. 7,944,670.

(60) Provisional application No. 60/983,905, filed on Oct. 30, 2007.

(51) Int. Cl.
| | |
|---|---|
| H01C 7/12 | (2006.01) |
| H02H 1/00 | (2006.01) |
| H02H 1/04 | (2006.01) |
| H02H 3/22 | (2006.01) |
| H02H 9/06 | (2006.01) |

(52) U.S. Cl. .................... 361/119; 361/111; 361/118
(58) Field of Classification Search .................. 361/119
See application file for complete search history.

(56) References Cited

U.S. PATENT DOCUMENTS

| | | | |
|---|---|---|---|
| 2,030,179 A | 2/1936 | Potter | |
| 3,167,729 A | 1/1965 | Hall | |
| 3,323,083 A | 5/1967 | Ziegler | |
| 3,619,721 A | 11/1971 | Westendorp | |
| 3,663,901 A | 5/1972 | Forney, Jr. | |
| 3,731,234 A | 5/1973 | Collins | |
| 3,750,053 A | 7/1973 | LeDonne | |
| 3,783,178 A | 1/1974 | Philibert | |
| 3,831,110 A | 8/1974 | Eastman | |
| 3,845,358 A | 10/1974 | Anderson et al. | |
| 3,944,937 A | 3/1976 | Fujisawa et al. | |
| 3,980,976 A | 9/1976 | Tadama et al. | |
| 4,046,451 A | 9/1977 | Juds et al. | |
| 4,047,120 A | 9/1977 | Lord et al. | |
| 4,112,395 A | 9/1978 | Seward | |
| 4,262,317 A | 4/1981 | Baumbach | |
| 4,359,764 A | 11/1982 | Block | |
| 4,384,331 A | 5/1983 | Fukuhara et al. | |
| 4,409,637 A | 10/1983 | Block | |
| 4,481,641 A | 11/1984 | Gable et al. | |
| 4,554,608 A | 11/1985 | Block | |
| 4,563,720 A | 1/1986 | Clark | |

(Continued)

FOREIGN PATENT DOCUMENTS

CH              675933 A5    11/1990

(Continued)

*Primary Examiner* — Dharti Patel

(74) *Attorney, Agent, or Firm* — Snell & Wilmer LLP

(57) ABSTRACT

A surge protection circuit may include a tuned circuit board with traces designed to provide a surge protected and RF isolated DC path while propagating RF signals through the PCB dielectric with microstrip lines. The surge protection circuit utilizes high impedance RF decoupling devices such as quarterwave traces or inductors which isolate the multi-stage DC protection scheme which may include a gas discharge tube, serial surge impeding devices such as inductors and/or resistors, a decoupled air/spark gap device and a Zener diode junction.

19 Claims, 4 Drawing Sheets

U.S. PATENT DOCUMENTS

| | | | |
|---|---|---|---|
| 4,586,104 A | 4/1986 | Standler | |
| 4,689,713 A | 8/1987 | Hourtane et al. | |
| 4,698,721 A | 10/1987 | Warren | |
| 4,727,350 A | 2/1988 | Ohkubo | |
| 4,952,173 A | 8/1990 | Peronnet et al. | |
| 4,984,146 A | 1/1991 | Black et al. | |
| 4,985,800 A | 1/1991 | Feldman et al. | |
| 5,053,910 A * | 10/1991 | Goldstein | 361/111 |
| 5,057,964 A | 10/1991 | Bender et al. | |
| 5,102,818 A | 4/1992 | Paschke et al. | |
| 5,122,921 A | 6/1992 | Koss | |
| 5,124,873 A | 6/1992 | Wheeler et al. | |
| 5,142,429 A | 8/1992 | Jaki | |
| 5,166,855 A | 11/1992 | Turner | |
| 5,278,720 A | 1/1994 | Bird | |
| 5,321,573 A | 6/1994 | Person et al. | |
| 5,353,189 A | 10/1994 | Tomlinson | |
| 5,442,330 A | 8/1995 | Fuller et al. | |
| 5,537,044 A | 7/1996 | Stahl | |
| 5,617,284 A | 4/1997 | Paradise | |
| 5,625,521 A | 4/1997 | Luu | |
| 5,667,298 A | 9/1997 | Musil et al. | |
| 5,721,662 A | 2/1998 | Glaser et al. | |
| 5,781,844 A | 7/1998 | Spriester et al. | |
| 5,790,361 A | 8/1998 | Minich | |
| 5,844,766 A | 12/1998 | Miglioli et al. | |
| 5,854,730 A | 12/1998 | Mitchell et al. | |
| 5,953,195 A | 9/1999 | Pagliuca | |
| 5,966,283 A | 10/1999 | Glaser et al. | |
| 5,982,602 A | 11/1999 | Tellas et al. | |
| 5,986,869 A | 11/1999 | Akdag | |
| 6,054,905 A | 4/2000 | Gresko | |
| 6,060,182 A | 5/2000 | Tanaka et al. | |
| 6,061,223 A | 5/2000 | Jones et al. | |
| 6,086,544 A | 7/2000 | Hibner et al. | |
| 6,115,227 A | 9/2000 | Jones et al. | |
| 6,137,352 A | 10/2000 | Germann | |
| 6,141,194 A | 10/2000 | Maier | |
| 6,177,849 B1 | 1/2001 | Barsellotti et al. | |
| 6,236,551 B1 | 5/2001 | Jones et al. | |
| 6,243,247 B1 * | 6/2001 | Akdag et al. | 361/111 |
| 6,252,755 B1 | 6/2001 | Willer | |
| 6,281,690 B1 | 8/2001 | Frey | |
| 6,292,344 B1 | 9/2001 | Glaser et al. | |
| 6,342,998 B1 | 1/2002 | Bencivenga et al. | |
| 6,381,283 B1 | 4/2002 | Bhardwaj et al. | |
| 6,385,030 B1 | 5/2002 | Beene | |
| 6,394,122 B1 | 5/2002 | Sibley et al. | |
| 6,421,220 B2 | 7/2002 | Kobsa | |
| 6,502,599 B1 | 1/2003 | Sibley et al. | |
| 6,527,004 B1 | 3/2003 | Sibley et al. | |
| 6,721,155 B2 | 4/2004 | Ryman | |
| 6,754,060 B2 | 6/2004 | Kauffman | |
| 6,757,152 B2 | 6/2004 | Galvagni et al. | |
| 6,785,110 B2 | 8/2004 | Bartel et al. | |
| 6,789,560 B1 | 9/2004 | Sibley et al. | |
| 6,814,100 B1 | 11/2004 | Sibley et al. | |
| 6,968,852 B1 | 11/2005 | Sibley | |
| 6,975,496 B2 | 12/2005 | Jones et al. | |
| 7,082,022 B2 * | 7/2006 | Bishop | 361/119 |
| 7,104,282 B2 | 9/2006 | Hooker et al. | |
| 7,106,572 B1 | 9/2006 | Girard | |
| 7,130,103 B2 | 10/2006 | Murata | |
| 7,159,236 B2 | 1/2007 | Abe et al. | |
| 7,221,550 B2 * | 5/2007 | Chang et al. | 361/118 |
| 7,250,829 B2 | 7/2007 | Namura | |
| 7,430,103 B2 * | 9/2008 | Kato | 361/212 |
| 7,623,332 B2 | 11/2009 | Frank et al. | |
| 7,808,752 B2 | 10/2010 | Richiuso et al. | |
| 2002/0167302 A1 | 11/2002 | Gallavan | |
| 2002/0191360 A1 | 12/2002 | Colombo et al. | |
| 2003/0072121 A1 | 4/2003 | Bartel et al. | |
| 2003/0211782 A1 | 11/2003 | Esparaz et al. | |
| 2004/0121648 A1 | 6/2004 | Voros | |
| 2004/0145849 A1 | 7/2004 | Chang et al. | |
| 2004/0264087 A1 | 12/2004 | Bishop | |
| 2005/0036262 A1 | 2/2005 | Siebenthall et al. | |
| 2005/0044858 A1 | 3/2005 | Hooker et al. | |
| 2005/0176275 A1 | 8/2005 | Hoopes et al. | |
| 2005/0185354 A1 | 8/2005 | Hoopes | |
| 2006/0146458 A1 | 7/2006 | Mueller | |
| 2006/0198075 A1 * | 9/2006 | Kato | 361/118 |
| 2007/0053130 A1 | 3/2007 | Harwath | |
| 2007/0139850 A1 | 6/2007 | Kamel et al. | |
| 2009/0103226 A1 | 4/2009 | Penwell et al. | |
| 2009/0109584 A1 | 4/2009 | Jones et al. | |
| 2009/0284888 A1 | 11/2009 | Bartel et al. | |
| 2011/0080683 A1 | 4/2011 | Jones et al. | |
| 2011/0141646 A1 | 6/2011 | Jones et al. | |
| 2011/0159727 A1 | 6/2011 | Howard et al. | |

FOREIGN PATENT DOCUMENTS

| | | |
|---|---|---|
| JP | 11-037400 | 2/1999 |
| KR | 1020090018497 | 2/2009 |
| WO | WO 9510116 | 4/1995 |
| WO | PCT/US03/17050 | 5/2003 |
| WO | WO 2011-119723 | 12/2011 |

* cited by examiner

SURGE PROTECTION CIRCUIT FOR PASSING DC AND RF SIGNALS

CLAIM OF PRIORITY UNDER 35 U.S.C. §120

This application is a continuation of and claims the benefit and priority of U.S. patent application Ser. No. 12/262,107, entitled "SURGE PROTECTION CIRCUIT FOR PASSING DC AND RF SIGNALS," filed on Oct. 30, 2008, now U.S. Pat. No. 7,944,670, which claims the benefit and priority of U.S. Provisional Application No. 60/983,905, filed on Oct. 30, 2007. The entire disclosures of each of these applications are incorporated herein by reference.

BACKGROUND

1. Field

The invention relates to surge protection. More particularly, the invention relates to a surge protection circuit for passing dc and rf signals.

2. Related Art

Communications equipment, such as cell towers, base stations, and mobile devices, are increasingly manufactured using small electronic components which are very vulnerable to damage from electrical surges. Surge variations in power and transmission line voltages, as well as noise, can change the frequency range of operation and can severely damage and/or destroy the communications equipment. Moreover, communications equipment can be very expensive to repair and replace.

There are many sources that can cause harmful electrical surges. One source is radio frequency (rf) interference that can be coupled to power and transmission lines from a multitude of sources. The power and transmission lines act as large antennas that may extend over several miles, thereby collecting a significant amount of rf noise power from such sources as radio broadcast antennas. Another harmful source is conductive noise, which is generated by communications equipment connected to the power and transmission lines and which is conducted along the power lines to the communications equipment to be protected. Still another source of harmful electrical surges is lightning. Lightning is a complex electromagnetic energy source having potentials estimated at from 5 million to 20 million volts and currents reaching thousands of amperes.

Ideally, what is needed is a surge protection circuit on a tuned circuit board where the surge protection circuit utilizes high impedance rf decoupling devices, which isolate the multistage dc protection scheme.

SUMMARY

A surge protection circuit may include a tuned circuit board with traces designed to provide a surge protected and RF isolated DC path while propagating RF signals through the PCB dielectric with microstrip lines. The surge protection circuit utilizes high impedance RF decoupling devices such as quarterwave traces or inductors which isolate the multistage DC protection scheme which may include a gas discharge tube, serial surge impeding devices such as inductors and/or resistors, a decoupled air/spark gap device and a Zener diode junction.

A surge protection circuit comprising a circuit board, a gas discharge tube positioned on the circuit board, a surge center pin electrically connected to the gas discharge tube, a coupling microstrip, positioned on the circuit board and connected to the surge center pin, for propagating RF signals, and a protected center pin, connected to the coupling microstrip, for passing DC currents.

A surge protection circuit for passing DC and RF signals comprising a circuit board having a first side and a second side, a surge pin connected to the first side of the circuit board, a protected pin connected to the first side of the circuit board, a first coupling microstrip connected to the first side of the circuit board and connected to the surge pin, and a second coupling microstrip connected to the second side of the circuit board and connected to the protected pin. The surge protection circuit may also include a high-impedance device connected to the first coupling microstrip, an inductor connected to the high-impedance device, and a zener junction device connected to the inductor.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

Figure 1:
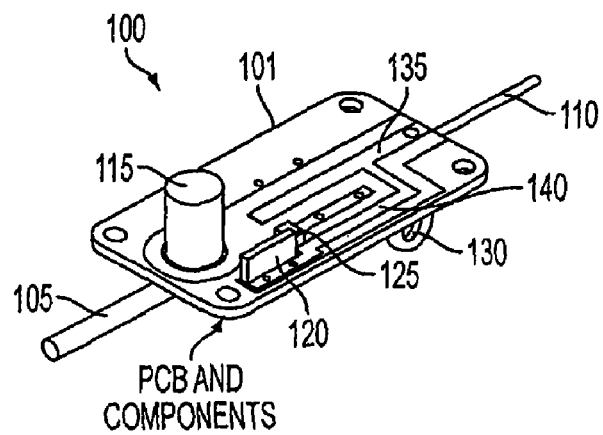
FIG. 1 is a bottom perspective view of a surge protection circuit according to an embodiment of the invention.
Figure 2:
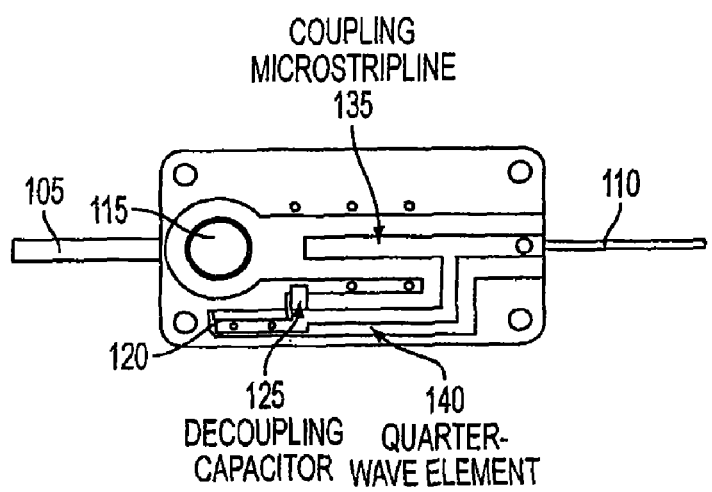
FIG. 2 is a bottom plan view of the surge protection circuit of FIG. 1 according to an embodiment of the invention.

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements. In addition, the first digit of each reference number indicates the figure in which the element first appears.

FIGS. 1-7 illustrate various views and schematics of a surge protection circuit 100 according to an embodiment of the invention. The surge protection circuit 100 provides RF coupling with DC pass or injector characteristics. The surge protection circuit 100 may include a printed circuit board (PCB) 101, a surge center pin 105, a protected center pin 110, a gas discharge tube 115, a zener junction 120, decoupling capacitors 125, 126 and 128, an impedance device 127, an inductor 130, a coupling microstripline 135, a high impedance element 140, and a spark gap element 145. The components or elements of the surge protection circuit 100 may be soldered to or formed on the PCB 101. The coupling microstripline 135 and the high impedance element 140 may be formed as traces on the PCB 101. The surge protection circuit 100 provides DC passing capabilities, superior voltage limiting protection, a compact size, and reasonable bandwidth.

The surge protection circuit 100 passes DC and RF signals between the surge center pin 105 and the protected center pin 110. The surge center pin 105 and the protected center pin 110 may be a coaxial line where a center pin propagates the DC currents and the RF signals and an outer shield surrounds the center pin. The surge center pin 105 and the protected center pin 110 maintain the system rf impedance (e.g., 50 ohm, 75 ohm, etc.). The DC voltage on the protected center pin 110 is used as the operating voltage to power the electronic components that are coupled to the protected center pin 110.

For high transient surge conditions, the gas discharge tube 115 may be incorporated or positioned on the PCB 101. The lead of the gas discharge tube 115 may be directly connected to the surge center pin 105 to significantly reduce the current flow through the thinner PCB copper traces and the opposite end of the gas discharge tube 115 may be mechanically and electrically connected to the circuit enclosure (not shown) providing a path to ground or connected directly to ground. The gas discharge tube 115 may be implemented to trigger in conjunction with the inductor 130 to add impedance to the surge/dc path. The gas discharge tube 115 is chosen based on capacitance, turn-on voltage, and surge current ratings. The typical ratings may be approximately 1.5 pF capacitance, 150V turn-on and 10 kA surge current.

The zener junction 120 may be a diode integrated into the PCB 101 by laterally embedding it through the PCB 101. That is, the zener junction 120 is positioned through the PCB 101. A first end of the zener junction 120 is connected to the DC pass trace and the inductor 130 and a second end of the zener junction 120 is connected to the PCB ground. During normal operations, the zener junction 120 is transparent. The zener junction 120 may be chosen based on circuit operating voltage, turn-on voltage, and surge current ratings. The typical ratings may be approximately 5 Vdc operating, 6V turn-on and 5 kA surge current.

The decoupling capacitor 125 is connected between the high impedance element 140 and circuit ground. The decoupling capacitor 126 is connected between impedance device 127 and circuit ground. The impedance device 127 (e.g., an inductor and/or a capacitor) may be connected to the inductor 130 and the zener junction 120 and/or the high impedance element 140. In one embodiment, the impedance device 127 can be connected to a DC injector port (see FIG. 7), which allows a current source to be connected to the DC injector port to provide DC currents to the circuit and/or equipment to be protected. The decoupling capacitor 128 is connected between the high impedance element 140 and circuit ground. The decoupling capacitors 125, 126 and 128 provide an RF shunt to stabilize the high impedance elements 140 and also some DC filtering.

Figure 3:
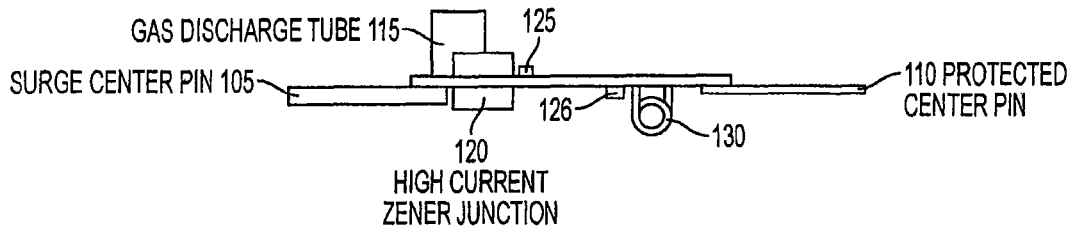
FIG. 3 is a side view of the surge protection circuit of FIG. 1 according to an embodiment of the invention.
Figure 4:
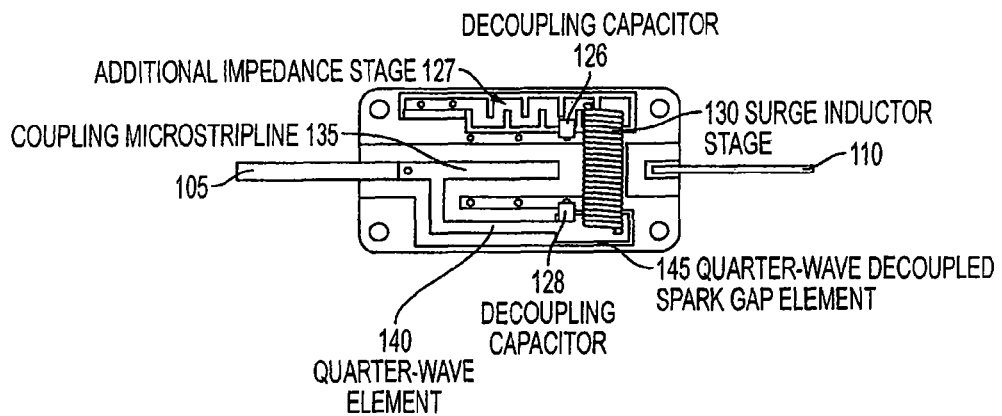
FIG. 4 is a top plan view of the surge protection circuit of FIG. 1 according to an embodiment of the invention.
Figure 5:
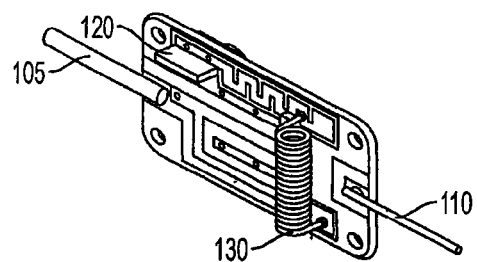
FIG. 5 is a top perspective view of the surge protection circuit of FIG. 1 according to an embodiment of the invention.
Figure 6:
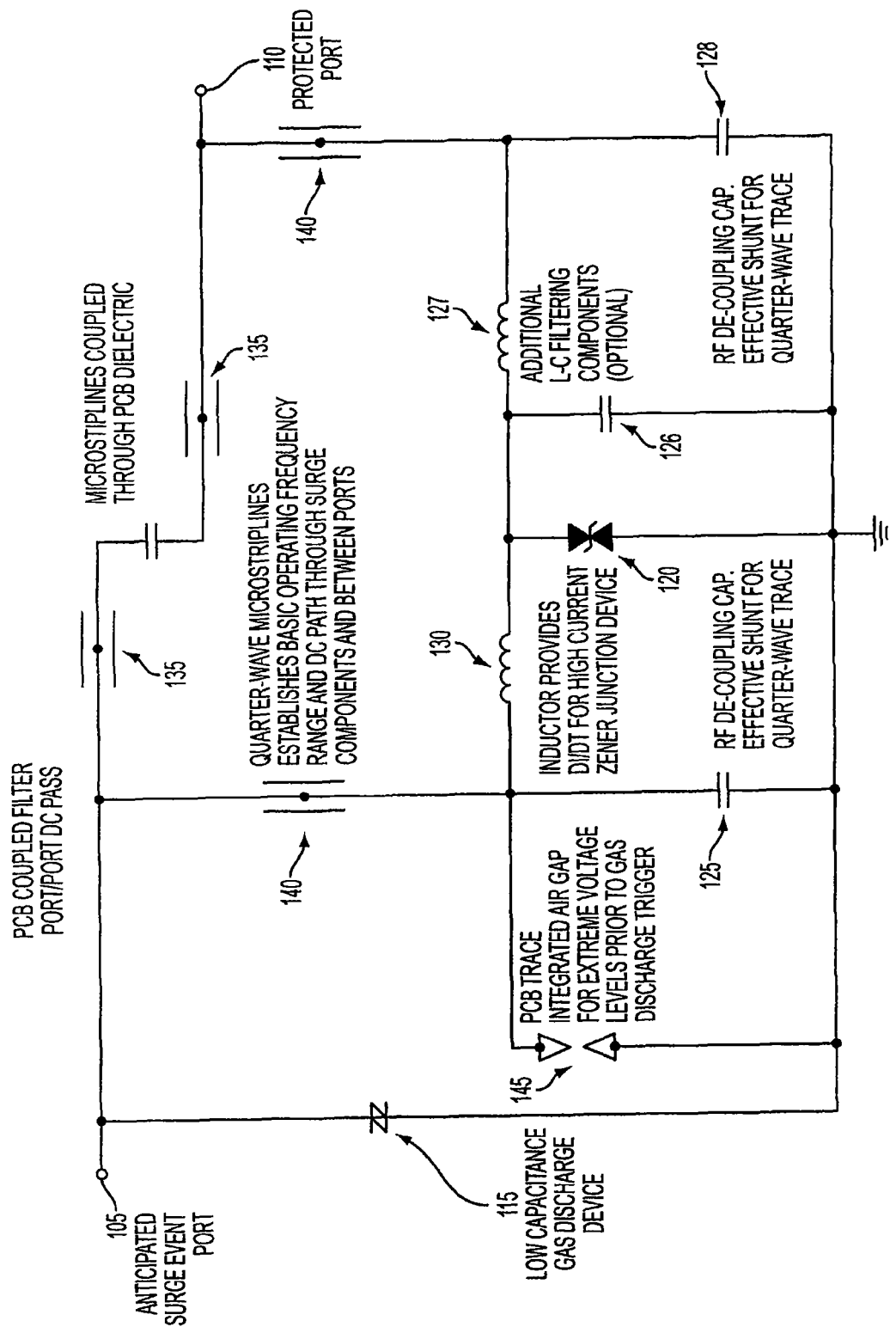
FIG. 6 is a schematic diagram of the surge protection circuit of FIG. 1 according to an embodiment of the invention.
Figure 7:
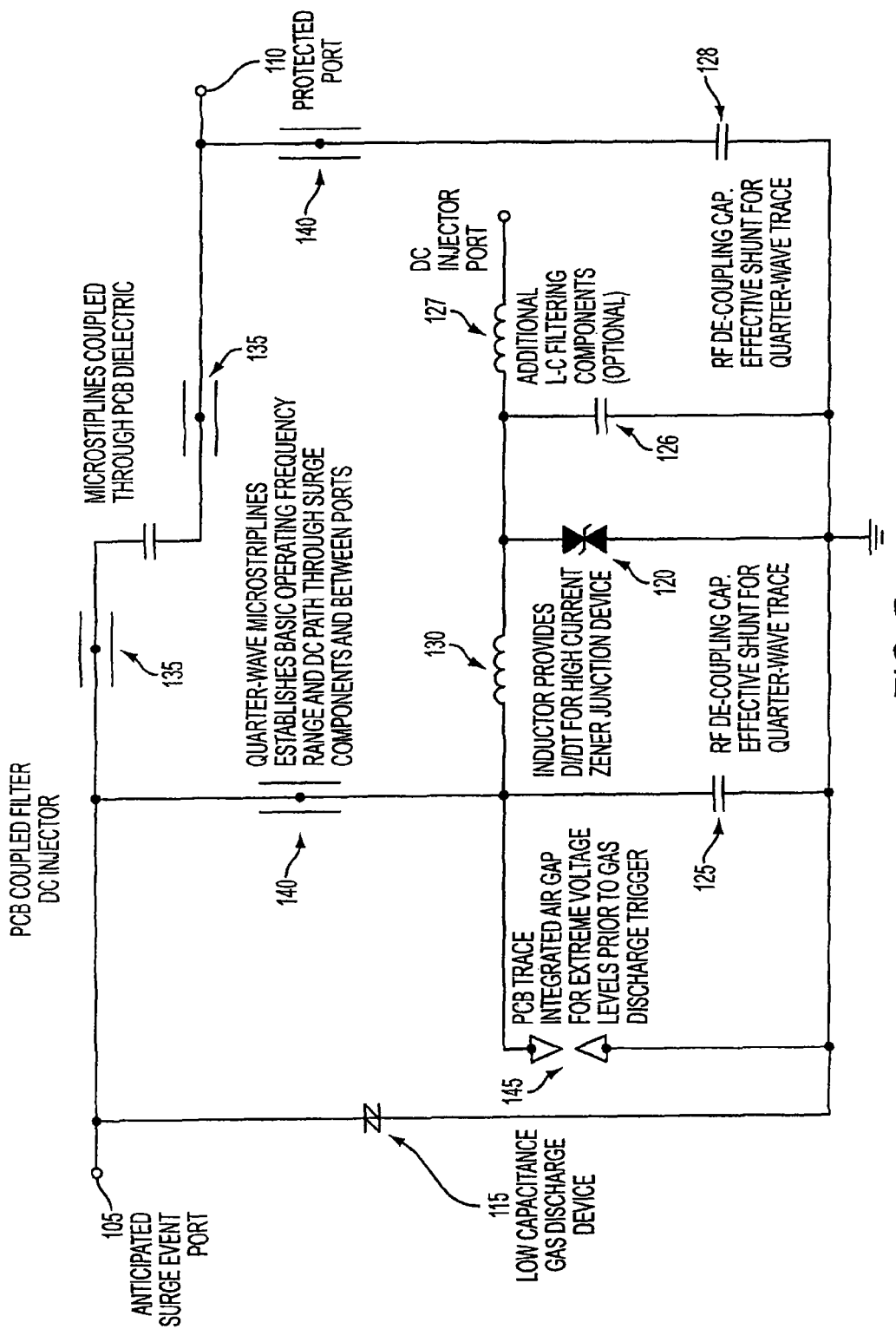
FIG. 7 is a schematic diagram of the surge protection circuit of FIG. 1 according to an embodiment of the invention.

The inductor 130 has an inductance of about >0.5 uH. The inductor 130 is soldered to the PCB 101 and is used to create high surge impedances. The inductor 130 may be attached to a first side of the PCB 101 and the gas discharge tube 115 may be attached to a second or opposite side of the PCB 101 as shown in FIGS. 1 and 3. At low frequencies (e.g., DC or 60 Hz), the inductor 130 is a short and allows these voltages to flow unimpeded to the other components. At higher voltage wavefronts and di/dt levels, the inductor 130 will impede currents and develop a voltage drop effectively attenuating voltage levels to the next protection stages. The inductor 130 also delays the surge currents to allow the gas discharge tube 115 time to trigger.

The coupling microstrips 135 may act as a transmission line (e.g., 50 ohm, 75 ohm, etc.) for the RF signals. RF coupling is achieved through line-line coupling on the PCB 101. The dielectric properties of the PCB 101 act as a capacitor allowing high frequency signals to be coupled between the dielectric while blocking all DC voltages. To achieve the RF coupling through the PCB 101, the width and length of the coupling microstrips 135 are a function of frequency so that the impedance between the surge center pin 105 and the protected center pin 110 is low and the amount of coupling of the RF energy is high.

To increase the RF impedance to DC components (e.g., diode, MOV, etc.) on the PCB 101, the high impedance element 140 is used to create a RF open at the desired frequencies. The high impedance element 140 may be of a quarter-wave device or element, inductor, resistor, and combinations thereof. The high impedance element 140 may have a length that is one-quarter the length of the fundamental frequency. An inductive element may also be chosen for lower fundamental frequencies or where PCB size is a premium. The high impedance element 140 is used for relatively narrow band applications. At other frequencies, high impedance element 140 acts as an RF short that improve the out of band rejection of RF signals on the RF path. In one embodiment, the high impedance element 140 is made from the metal or traces on the PCB 101. The high-impedance element 140 has a high resistance characteristic as a function of its frequency. The high-impedance element 140 can have a very low DC resistance, but a very high RF resistance.

The spark gap element 145 is positioned at the end of the high impedance element 140 and is in proximity to a ground trace in case the gas discharge tube 115 does not trigger fast enough during extreme over voltage events. The spark gap element 145 is connected to the decoupling capacitor 125, the inductor 130, and the high impedance element 140. The spark gap element 145 is de-coupled from the RF path and may be configured extremely close in proximity to the circuit ground discharge path without affecting RF performance. The spark gap element 145 may be about 0.025 inches allowing normal multistage action during events of less than about 10 kA 8 us/20 us surge characteristics. Events exceeding this and considered catastrophic will cause a sparkover at the spark gap element 145 effectively shorting the surge center pin 105 to ground.

The PCB ground plane and ground traces are electrically grounded to a box providing a low impedance ground path for surge currents. When the DC voltage on the surge center pin 105 is below a threshold voltage of the zener junction 120, no current passes across the zener junction 120 and all current passes from the surge center pin 105 to the protected center pin 110.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A surge protection device comprising:
   a circuit board having a first surface and a second surface opposing the first surface;
   a surge node positioned on the circuit board;
   a protected node positioned on the circuit board;
   a first microstrip positioned on the first surface of the circuit board and connected to the surge node;
   a second microstrip positioned on the second surface of the circuit board and connected to the protected node, the second microstrip dielectrically coupled to the first microstrip via the circuit board for passing an RF signal from the surge node to the protected node; and a DC path for passing a DC signal from the surge node to the protected node, the DC path coupled with a ground source for redirecting a surge signal to the ground source.

2. The surge protection device of claim 1, wherein:

the first microstrip partially overlaps with the second microstrip to form a capacitor having a capacitance defined by a dielectric material of the circuit board, and the capacitor is for preventing a surge signal from passing from the surge node to the protected node.

3. The surge protection device of claim 1, wherein the DC path includes a low-pass device for blocking the RF signal, passing the DC signal, and conducting the surge signal to an intermediate node without significantly attenuating the surge signal.

4. The surge protection device of claim 3, wherein the low-pass device is a high impedance device connected to the surge node and the intermediate node.

5. The surge protection device of claim 3, wherein the low-pass device is a quarter-wave microstrip line connected to the surge node and the intermediate node.

6. The surge protection device of claim 3, wherein the DC path includes:

an inductor connected to the low-pass device, for attenuating the surge signal and passing the DC signal to the protected node, and a spark gap device connected to the intermediate node, for sinking the surge signal to the ground source.

7. The surge protection device of claim 6, wherein the DC path includes:

a Zener device connected to the inductor, for preserving a voltage level of the DC signal, and a decoupling capacitor connected to the inductor, for shunting the attenuated surge signal to the ground source.

8. The surge protection circuit of claim 1, further comprising a gas discharge device connected to the surge node, and for conducting a surge signal from the surge node to a ground source.

9. A surge protection device for passing DC and RF signals comprising:

a circuit board having a first surface and a second surface opposing the first surface, each of the first surface and the second surface including a metallic trace, the metallic traces at least partially overlapping with each other to form a capacitor therebetween;

a surge port connected to the metallic trace of the first surface of the circuit board;

a protected port connected to the metallic trace of the second surface of the circuit board so as to receive an RF signal from the surge port; and a DC path connected with the surge port and the protected port, for passing a DC signal from the surge port to the protected port and redirecting a surge signal from the surge port to a ground source.

10. The surge protection device of claim 9, wherein the DC path includes a first high impedance device connected to the surge port and a first node, a first inductor connected to the first node and a second node, a second inductor connected to the second node and a third node, and a second high impedance device connected to the third node and the protected port.

11. The surge protection device of claim 10, wherein the first high impedance device includes a quarter-wave element for rejecting the RF signal, passing the DC signal to the first node, and passing the surge signal to the first node without significantly reducing a signal strength thereof.

12. The surge protection device of claim 10, wherein the DC path includes a spark gap device connected between the first node and the ground source, and for attenuating the surge signal.

13. The surge protection device of claim 10, wherein the DC path includes a Zener device connected to the second node, and for sinking the surge signal to the ground source.

14. The surge protection device of claim 10, wherein the DC path includes:

a first decoupling capacitor connected to the first node, and for shunting the surge signal to the ground source, and a second decoupling capacitor connected to the second node and the ground source, and for forming an L-C filter with the second inductor.

15. The surge protection device of claim 9, further comprising a gas discharge device connected to the surge node and the ground source, and for reducing a current of the surge signal.

16. A method for passing DC power and protecting electronic components from power surge, the method comprising the steps of:

receiving a signal at a surge node;

passing, via an integrated capacitor formed between a first surface of a circuit board and a second surface of the circuit board opposing the first surface, an RF component of the signal to a protected node;

redirecting, via a low pass device, a surge component and a DC component of the signal from the surge node to an intermediate node;

shunting the surge component from the intermediate node to a ground source; and conducting, via an inductor, the DC component from the intermediate node to the protected node.

17. The method of claim 16, wherein the redirecting step includes preserving a power level of the surge component of the signal.

18. The method of claim 16, wherein the passing step includes:

forwarding the RF component of the signal to a first microstrip formed on the first surface of the circuit board, and receiving the RF component of the signal at a second microstrip partially overlapping with the first microstrip and formed on the second surface of the circuit board.

19. The method of claim 16, further comprising the step of attenuating, via a spark gap device, the surge component of the signal.

* * * * *